(12) United States Patent
Choi et al.

(10) Patent No.: US 11,895,218 B2
(45) Date of Patent: Feb. 6, 2024

(54) ULTRA-LOW JITTER LOW-POWER W/D-BAND PHASE-LOCKED LOOP USING POWER-GATING INJECTION-LOCKED FREQUENCY MULTIPLIERBASED PHASE DETECTOR

(71) Applicant: Korea Advanced Institute of Science and Technology, Daejeon (KR)

(72) Inventors: Jaehyouk Choi, Daejeon (KR); Suneui Park, Daejeon (KR); Seyeon Yoo, Daejeon (KR); Seojin Choi, Daejeon (KR); Jooeun Bang, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/720,257

(22) Filed: Apr. 13, 2022

(65) Prior Publication Data

US 2023/0224138 A1    Jul. 13, 2023

(30) Foreign Application Priority Data

Jan. 11, 2022 (KR) .................. 10-2022-0004049

(51) Int. Cl.
*H04L 7/033* (2006.01)
*H03L 7/08* (2006.01)

(52) U.S. Cl.
CPC .............. *H04L 7/033* (2013.01); *H03L 7/08* (2013.01)

(58) Field of Classification Search
CPC ... H03L 7/06; H03L 7/08; H03L 7/091; H04L 7/033; H04L 7/0331; H04L 7/0332; H04L 7/04

USPC ................ 375/373, 375, 376; 327/155, 156; 370/516; 713/503
See application file for complete search history.

(56) References Cited

U.S. PATENT DOCUMENTS

| | | | |
|---|---|---|---|
| 8,373,481 B2* | 2/2013 | Gao | H03L 7/0812 327/158 |
| 8,432,200 B1* | 4/2013 | Thakur | H03L 7/0893 327/147 |
| 2003/0076175 A1* | 4/2003 | Fischer | H03L 7/093 331/17 |
| 2005/0046452 A1* | 3/2005 | Briones | H03L 7/113 327/156 |
| 2008/0061891 A1* | 3/2008 | Hongo | G01S 7/35 327/156 |

(Continued)

FOREIGN PATENT DOCUMENTS

| KR | 100326310 B1 * | 3/2002 |
|---|---|---|
| KR | 10-2017-0047480 | 5/2017 |

*Primary Examiner* — Young T. Tse
(74) *Attorney, Agent, or Firm* — PCFB LLC

(57) ABSTRACT

Proposed are an ultra-low jitter low-power phase-locked loop using a power-gating injection-locked frequency multiplier-based phase detector (PG-ILFM PD) and an operating method thereof. The proposed PG-ILFM PD includes a replica voltage controlled oscillator (R-VCO) configured to cut off the power supply of the R-VCO repeatedly based on a reference signal $S_{REF}$ and a fundamental sampling phase detector (FSPD) configured to receive an output signal $S_{ILFM}$ of the R-VCO as a reference signal for sampling and detect a phase error of a main voltage controlled oscillator (M-VCO).

18 Claims, 16 Drawing Sheets

(56) References Cited

U.S. PATENT DOCUMENTS

2010/0295621 A1* 11/2010 Mar .................. H03L 7/16
                                                                              331/18

* cited by examiner

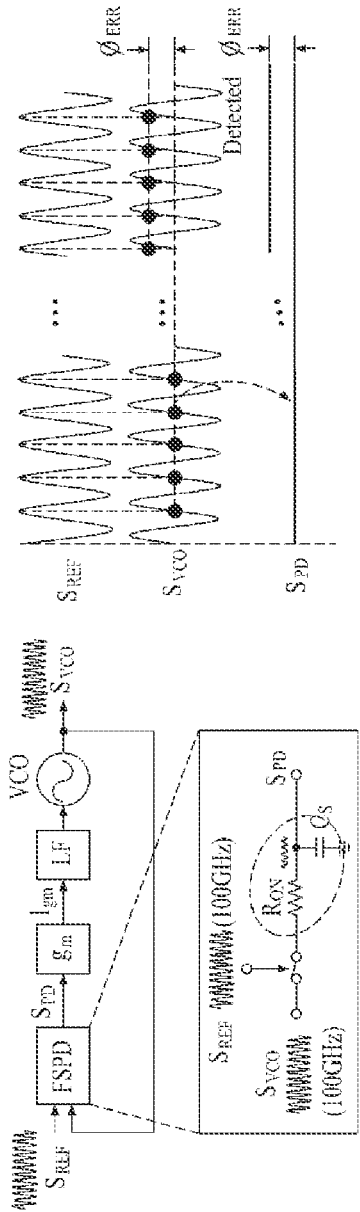
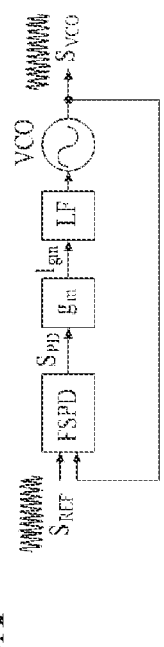
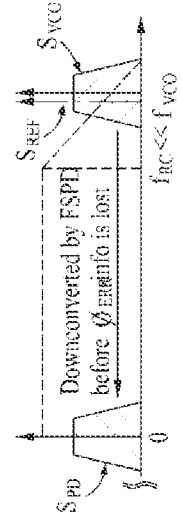
FIG. 5A
FIG. 5B
FIG. 5C
PRIOR ART (a)

[C. Jany, JSSC'15]

(b)

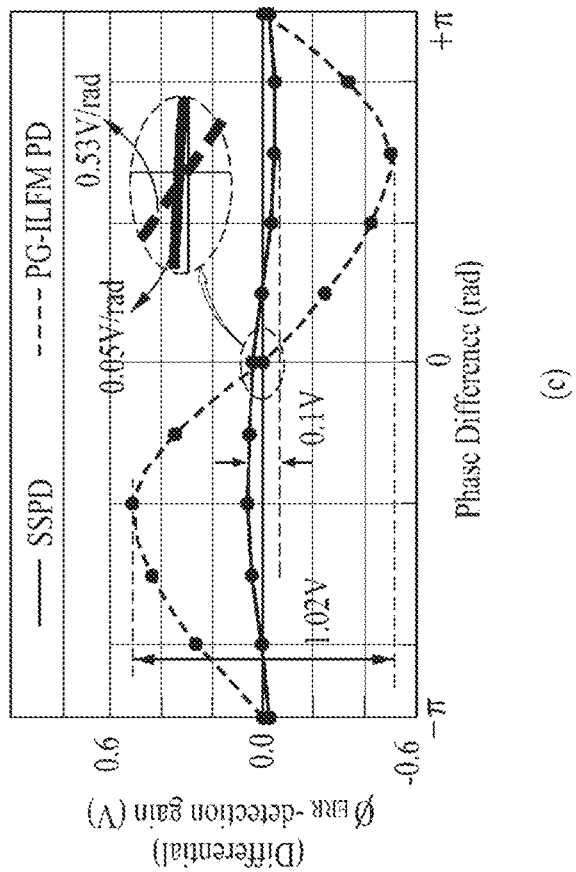
FIG. 8C
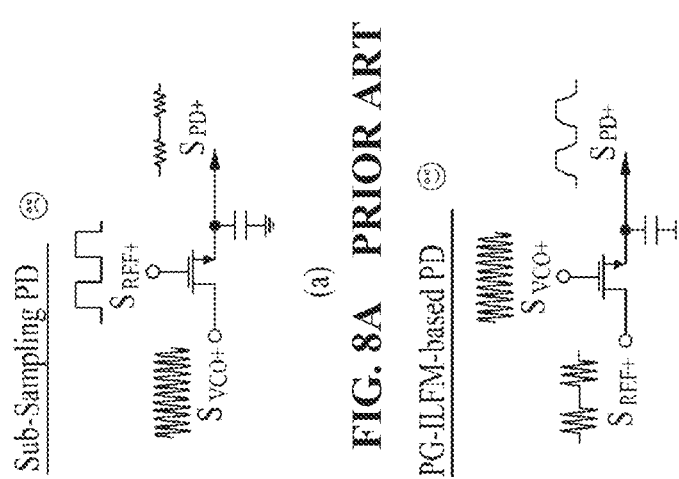
FIG. 8A PRIOR ART
FIG. 8B

ULTRA-LOW JITTER LOW-POWER W/D-BAND PHASE-LOCKED LOOP USING POWER-GATING INJECTION-LOCKED FREQUENCY MULTIPLIERBASED PHASE DETECTOR

CROSS-REFERENCES TO RELATED APPLICATIONS

This application is based on and claims priority under 35 U.S.C. 119 to Korean Patent Application No. 10-2022-0004049, filed on 11 Jan. 2022 in the Korean intellectual property office, the disclosure of which is herein incorporated by reference in its entirety.

TECHNICAL FIELD

The present disclosure relates to an ultra-low jitter low-power W/D-band phase-locked loop (PLL) using a power-gating injection-locked frequency multiplier-based phase detector (PG-ILFM PD).

BACKGROUND OF THE DISCLOSURE

In 2020s, preparations for the 6G communication era that will be the platform of a future IT technology are started with the aim of commercialization in 2030s in line with the commercialization of a 5G communication system that will play the role of a platform of the IT technology.

All performance indices of 6G communication that will be newly proposed and developed are expected to be advanced 10 times to 100 times or more compared to 5G communication. Among them, in particular, in order to achieve a very high data rate having targeted 1 Tbps that is a level equal to 50 times of 5G communication standard performance, it is essential to use a carrier frequency of 100 GHz or more, which can secure a physically wide bandwidth in 6G communication. It is expected that 6G communication needs to use a high frequency band that reach a maximum of 300 GHz. A W-band (75 to 140 GHz) and a D-band (140 to 170 GHz) that define the vicinity of the 100 GHz band by considering physical limits of constitution hardware and a semiconductor chip are told as the most realistic solution. Accordingly, research for generating an ultra-low jitter signal having a 100 GHz or more band (W-band/D-band), that is, a core of 6G communication, is essential.

The most common structure used to generate such an ultra-low jitter signal includes a charge pump (CP) and a phase-locked loop (PLL). In this case, as the frequency of the generated signal rises to 100 GHz or more, there is a problem in that free-running phase noise (PN) occurs because the Q-factor of a voltage-controlled oscillator (VCO) becomes smaller.

FIGS. 1A and 1B are diagrams illustrating output phase noise according to a bandwidth of a phase-locked loop (PLL) according to a conventional technology.

FIG. 1A illustrates phase noise when $f_{BW}$, that is, a bandwidth (BW) of the PLL, is narrow. FIG. 1B illustrates phase noise when $f_{BW}$ of the PLL is wide.

If the bandwidth of the PLL is narrow, as in FIG. 1A, phase noise of the W-band VCO is great. Accordingly, the phase noise of the W-band VCO needs to be greatly reduced as in FIG. 1B by widening the bandwidth of the PLL. However, in the charge-pump PLL, a noise size within a loop bandwidth is very large because a phase error detection gain of a phase-frequency detector (PFD) at the first stage of the loop is very small when a frequency multiplication factor is high.

FIGS. 2A and 2B are diagrams illustrating a phase frequency detector (PFD) according to a bandwidth of a charge-pump PLL according to a conventional technology and a sub-sampling PD (SSPD) and gm noise according to a bandwidth of a PLL in a jitter and sub-sampling PLL (SSPLL) of a charge pump.

In order to solve the problem in that the noise size within the loop bandwidth is large because the phase error detection gain is very small, a method using a sub-sampling phase-locked loop (SSPLL) using the SSPD instead of the PFD used in the charge-pump PLL may be considered.

FIG. 2A illustrates that a large amount of noise of the PFD and the charge pump is input when the bandwidth of the charge-pump PLL is wide. FIG. 2B illustrates that the SSPD and gm noise are input as a small quantity when the bandwidth of the PLL is wide in the SSPLL.

Noise within a loop bandwidth can be greatly reduced as in FIG. 2B because the SSPD can originally achieve a high phase error detection gain in several GHz bands.

FIGS. 3A and 3B are diagrams for describing an operation when the SSPLL according to a conventional technology operates in the W-band.

FIG. 3A illustrates a model diagram when the SSPLL operates in the W-band. FIG. 3B is a diagram illustrating a timing diagram when the SSPLL operates in the W-band.

The SSPLL using the SSPD has an advantage in that it is applied only in several GHz bands, but cannot achieve the lowest noose performance because the phase error detection gain of the SSPD in 100 GHz or more is greatly reduced. The reason for this is that a pole having a low-pass filter (LF) characteristic is naturally formed in the SSPD composed of an MOSFET and a capacitor as in FIGS. 3A and 3B (a frequency $f_{RC}$ of a corresponding pole). Accordingly, in FIGS. 3A and 3B, an output signal of a VCO is delivered as $S_{PD}$, that is, an output signal of a PD, because amplitude of $S_{VCO}$, that is, the output signal of the VCO, is greatly reduced. This means that the phase error detection gain of the PD is greatly reduced. Accordingly, it is necessary to develop a PLL having a high phase error detection gain even in a frequency band of 100 GHz or more by overcoming the disadvantage of the existing charge-pump PLL and SSPLL.

PRIOR ART DOCUMENT

Patent Document

Korean Patent Application Publication No. 10-2017-0047480 (May 8, 2017)

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

An embodiment of the present disclosure is to provide an ultra-low jitter low-power phase-locked loop (PLL) using a power-gating injection-locked frequency multiplier-based phase detector (PG-ILFM PD), which has a high phase error detection gain even in a frequency band of 100 GHz or more, in order to improve a problem in that a noise size within a loop bandwidth is great because a phase error detection gain of a phase frequency detector (PFD) at the first stage of the loop is very small when the frequency multiplier of the existing charge-pump PLL is high and to improve a problem in that the lowest noise performance cannot be achieved because a phase error detection gain of a sub-sampling PD (SSPD) of the existing sub-sampling PLL (SSPLL) is greatly reduced in 100 GHz or more.

In an aspect, in a proposed ultra-low jitter low-power phase-locked loop using a power-gating injection-locked frequency multiplier-based phase detector (PG-ILFM PD), the PG-ILFM PD includes a replica voltage controlled oscillator (R-VCO) configured to cut off the power supply of the R-VCO repeatedly based on a reference signal $S_{REF}$ and a fundamental sampling phase detector (FSPD) configured to receive an output signal $S_{ILFM}$ of the R-VCO as a reference signal for sampling and detect a phase error of a main voltage controlled oscillator (M-VCO).

The PLL according to an embodiment of the present disclosure is further includes a M-VCO configured to detect the phase error by feeding a final output signal back to the FSPD of the PG-ILFM PD.

The R-VCO according to an embodiment of the present disclosure has a structure identical with a structure of the M-VCO and is used to multiply a frequency of the reference signal $S_{REF}$.

The R-VCO according to an embodiment of the present disclosure is configured to synchronize a phase of the output signal $S_{ILFM}$ of the R-VCO with the reference signal $S_{REF}$ regardless of a frequency multiplier by outputting an output signal only while the reference signal $S_{REF}$ is high.

According to an embodiment of the present disclosure, the output signal $S_{ILFM}$ of the R-VCO and an output signal $S_{VCO}$ of the M-VCO have an identical frequency band, and phase error information detected in the PG-ILFM PD is outputted without a loss of the phase error information, so that a phase error detection gain may be increased.

The PLL according to an embodiment of the present disclosure further includes a resampler configured to perform resampling in order to reduce a spur attributable to an output of meaningless information by the PG-ILFM PD while the reference signal $S_{REF}$ is low.

the PLL according to an embodiment of the present disclosure further includes a frequency offset canceller (FOC) configured to remove a frequency deviation between the R-VCO of the PG-ILFM PD and the M-VCO.

The FOC according to an embodiment of the present disclosure is configured to alternately operate at a different phase with respect to a resampling operation for phase locking of the phase-locked loop while the reference signal $S_{REF}$ is high.

The FOC according to an embodiment of the present disclosure is configured to perform resampling for reducing a frequency offset of the R-VCO after the resampling operation for the phase locking.

The PLL according to an embodiment of the present disclosure further includes adjusting, by a gm amplifier, a control voltage of the M-VCO by generating a current proportional to the output signal of the resampler.

In another aspect, an operating method of a PLL including a power-gating injection-locked frequency multiplier-based phase detector (PG-ILFM PD) includes outputting, by an R-VCO of the PG-ILFM PD, an output signal $S_{ILFM}$ by repeating the supply and blocking of an input signal based on a reference signal $S_{REF}$, receiving, by an FSPD of the PG-ILFM PD, the output signal $S_{ILFM}$ of the R-VCO as a reference signal for sampling and detecting a phase error of an M-VCO, performing, by a resampler, resampling in order to reduce a spur attributable to the output of meaningless information by the PG-ILFM PD while the reference signal $S_{REF}$ is low, removing, by an FOC, a frequency deviation between the R-VCO of the PG-ILFM PD and the M-VCO, adjusting, by a gm amplifier, a control voltage of the M-VCO by generating a current proportional to the output signal of the resampler, and receiving, by the FSPD of the PG-ILFM PD, the final output signal of the M-VCO through feedback in order to detect a phase error.

According to embodiments of the present disclosure, the problem in that a noise size within a loop bandwidth is great because a phase error detection gain of a phase frequency detector (PFD) at the first stage of a loop is very small when the frequency multiplier of the existing charge-pump PLL is high and the problem in that the lowest noise performance cannot be achieved because a phase error detection gain of a sub-sampling PD (SSPD) of the existing sub-sampling PLL (SSPLL) is greatly reduced in 100 GHz or more can be improved through the ultra-low jitter low-power PLL using the PG-ILFM PD, which has a high phase error detection gain even in a frequency band of 100 GHz or more.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein:

FIGS. 5A, 5B, and 5C are diagrams for describing a fundamental sampling phase detector (FSPD) according to a conventional technology.

FIGS. 8A, 8B, and 8C illustrate simulation results of a phase error detection gain of the PG-ILFM PD according to an embodiment of the present disclosure.

DETAILED DESCRIPTION

While illustrative embodiments have been illustrated and described, it will be appreciated that various changes can be made therein without departing from the spirit and scope of the disclosure.

The present disclosure proposes a phase-locked loop (PLL) based on a power-gating injection-locked frequency multiplier (PG-ILFM)-based new phase detector (PD) (PG-ILFM PD) in order to generate an ultra-low jitter W-band signal. The proposed PG-ILFM PD is based on high phase noise detection performance, and can significantly reduce noise in a phase detector (PD), a charge pump (CP), a loop filter (LF), etc. within a PLL bandwidth. Accordingly, a PLL bandwidth (BW) can be expanded regardless of in-band noise, and can resultantly significantly reduce noise of a voltage-controlled oscillator (VCO) having a low Q-factor of a W-band. In the present disclosure, a W-band PLL using the proposed PG-ILFM PD can have ultra-low noise performance of 100 fs or less in the corresponding frequency band based on such a technical background. Hereinafter, embodiments of the present disclosure are described in detail with reference to the accompanying drawings.

Figures 1A, 1B:
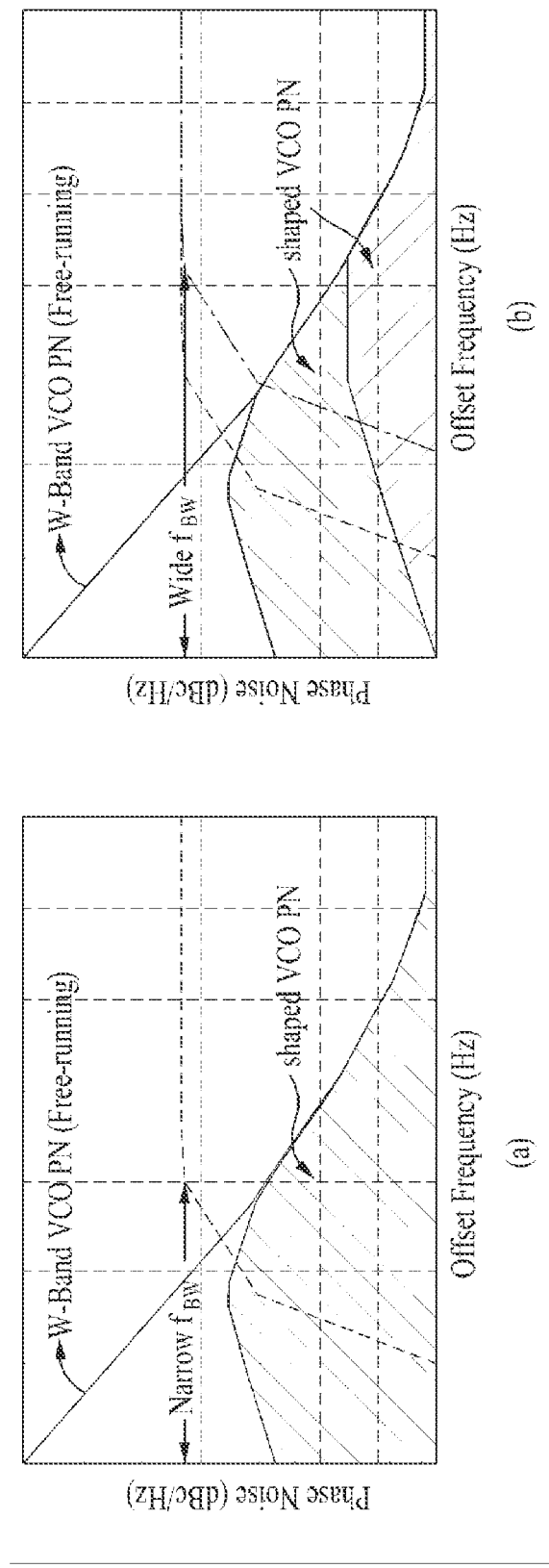
FIGS. 1A and 1B are diagrams illustrating output phase noise according to a bandwidth of a PLL according to a conventional technology.
Figures 2A, 2B:
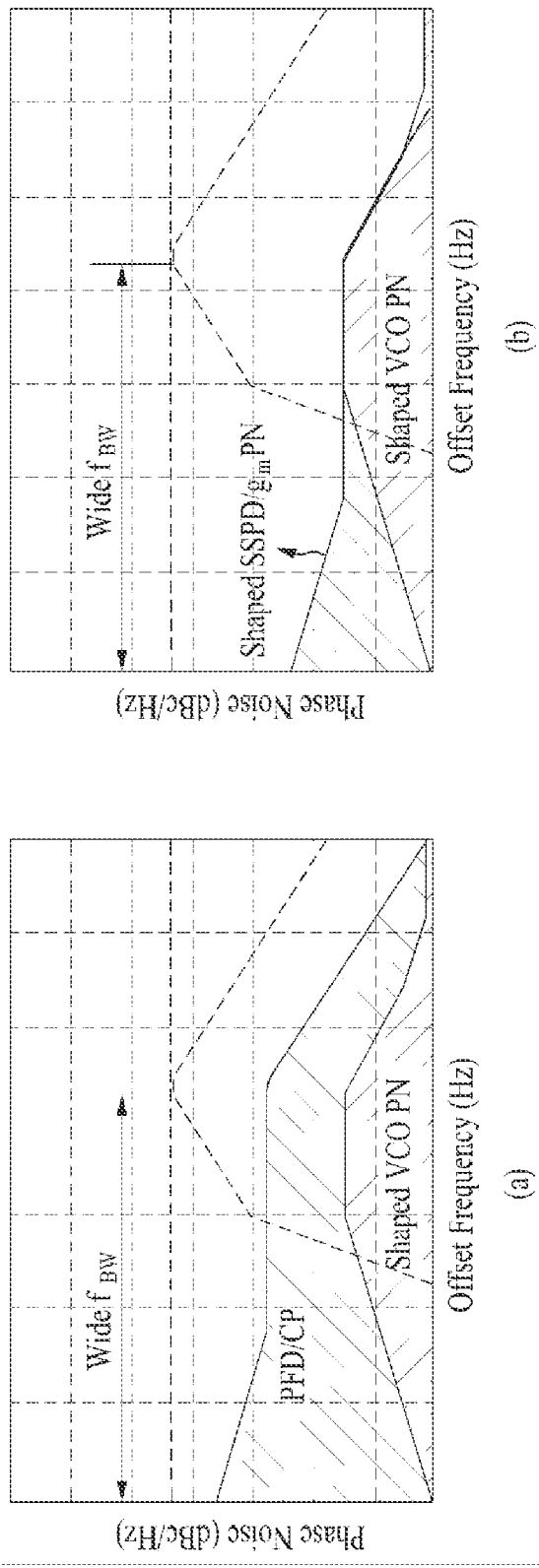
FIGS. 2A and 2B are diagrams illustrating a phase frequency detector (PFD) according to a bandwidth of a charge-pump PLL according to a conventional technology and a sub-sampling PD (SSPD) and gm noise according to a bandwidth of a PLL in a jitter and sub-sampling PLL (SSPLL) of a charge pump.
Figures 3A, 3B:
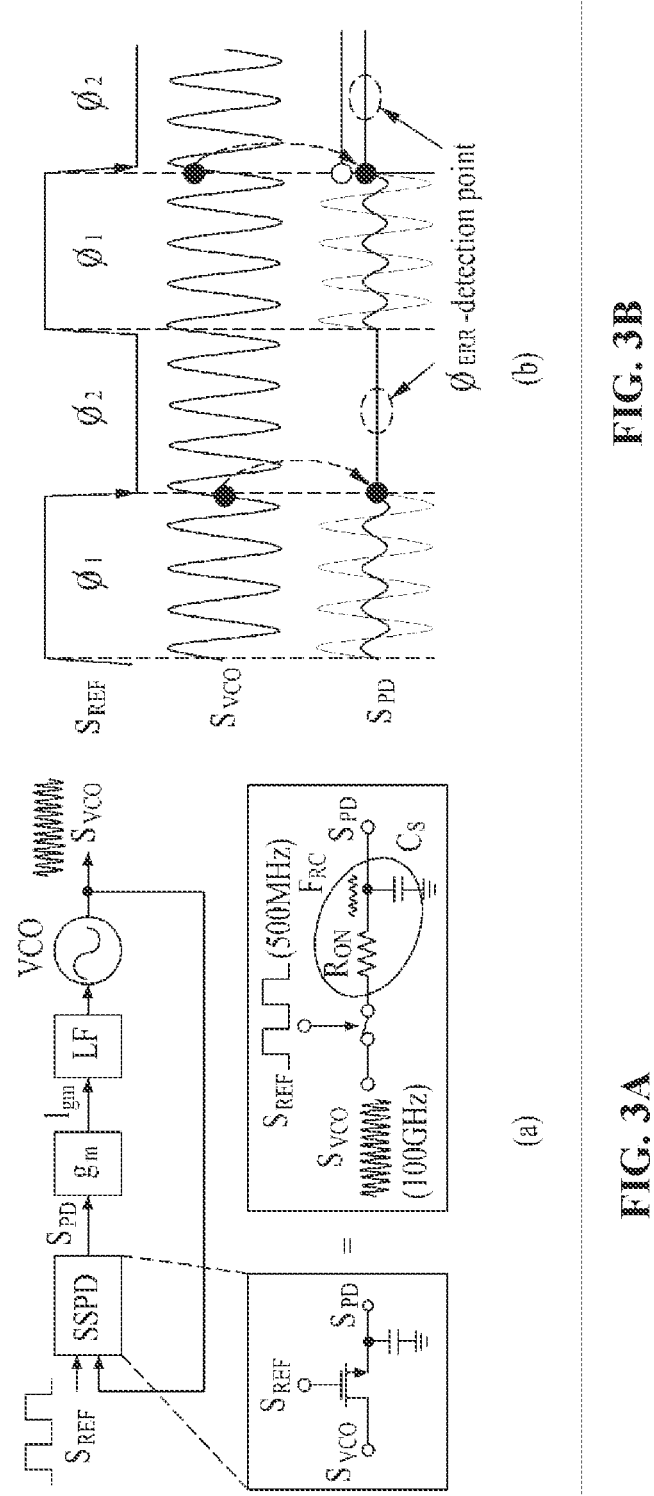
FIGS. 3A and 3B are diagrams for describing an operation when the SSPLL according to a conventional technology operates in the W-band.
Figure 4:
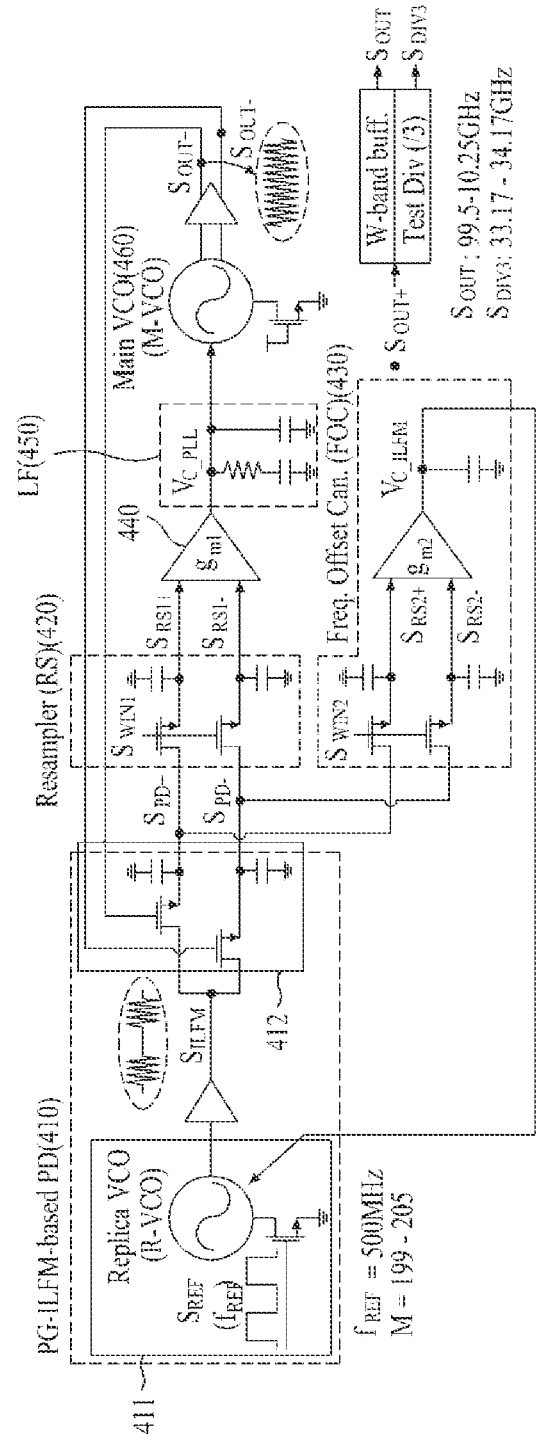
FIG. 4 is the entire circuit diagram of an ultra-low jitter low-power PLL using a power-gating injection-locked frequency multiplier-based phase detector (PG-ILFM PD) according to an embodiment of the present disclosure.

FIG. 4 is the entire circuit diagram of an ultra-low jitter low-power PLL using a power-gating injection-locked frequency multiplier-based phase detector (PG-ILFM PD) according to an embodiment of the present disclosure.

The ultra-low jitter low-power PLL using the proposed PG-ILFM PD include a PG-ILFM PD 410, a resampler (RS) 420, a frequency offset canceller (FOC) 430, a gm amplifier 440, a loop filter (LF) 450, and a main voltage controlled oscillator (M-VCO) 460.

The PG-ILFM PD 410 according to an embodiment of the present disclosure is a power-gating injection-locked frequency multiplier-based phase detector, and includes a replica voltage controlled oscillator (R-VCO) 411 and a fundamental sampling phase detector (FSPD) 412.

The R-VCO 411 according to an embodiment of the present disclosure repeats the supply and blocking of an input signal based on a reference signal $S_{REF}$.

The FSPD 412 according to an embodiment of the present disclosure receives an output signal $S_{ILFM}$ of the R-VCO 411 as a reference signal for sampling, and detects a phase error of the M-VCO 460.

The M-VCO 460 according to an embodiment of the present disclosure feeds the final output signal back to the FSPD 412 of the PG-ILFM PD 410 so that a phase error is detected.

The R-VCO 411 according to an embodiment of the present disclosure has the same structure as the M-VCO 460, and is used to multiply the frequency of the reference signal $S_{REF}$.

The R-VCO 411 according to an embodiment of the present disclosure synchronizes the phase of the output signal $S_{ILFM}$ of the R-VCO 411 with the reference signal $S_{REF}$ regardless of a frequency multiplier by outputting an output signal only while the reference signal $S_{REF}$ is high.

The output signal $S_{ILFM}$ of the R-VCO 411 and the output signal $S_{VCO}$ of the M-VCO 460 according to an embodiment of the present disclosure have the same frequency band. Accordingly, a phase error detection gain can be increased because phase error information detected by the PG-ILFM PD 410 is output without a loss of the phase error information.

The resampler 420 according to an embodiment of the present disclosure performs resampling in order to reduce a spur attributable to the output of meaningless information of the PG-ILFM PD 410 while the reference signal $S_{REF}$ is low.

The FOC 430 according to an embodiment of the present disclosure removes a frequency deviation between the R-VCO 411 of the PG-ILFM PD 410 and the M-VCO 460.

The FOC 430 according to an embodiment of the present disclosure alternately operates at a different phase with respect to a resampling operation for the phase locking of a PLL while the reference signal $S_{REF}$ is high. In other words, after the resampling operation for the phase locking, the FOC 430 performs resampling for reducing a frequency offset of the R-VCO 411.

The gm amplifier 440 according to an embodiment of the present disclosure adjusts a control voltage of the M-VCO 460 by generating a current proportional to the output signal of the resampler 420.

The loop filter (LF) 450 according to an embodiment of the present disclosure may transmit only a frequency signal having a cutoff frequency or less by attenuating a signal having a frequency equal to or higher than a specific cutoff frequency of a signal output by the gm amplifier 440.

The elements of the ultra-low jitter low-power PLL using the PG-ILFM PD according to an embodiment of the present disclosure are more specifically described with reference to FIGS. 5 to 8.

FIGS. 5A, 5B, and 5C are diagrams for describing a fundamental sampling phase detector (FSPD) according to a conventional technology.

FIG. 5A is a circuit diagram of the FSPD according to a conventional technology. FIG. is a timing diagram of an FSPD operation according to a conventional technology. FIG. is a diagram for describing frequency characteristics of the FSPD operation according to a conventional technology.

As described above, in order to form an ultra-low jitter W-band PLL, a phase error detection gain is important. Accordingly, in the present disclosure, the concept of the FSPD which may have a high phase error detection gain even in the W-band is applied.

In general, in the FSPD according to a conventional technology, a frequency of the reference signal $S_{REF}$ for sampling a phase error of the output signal $S_{VCO}$ of the VCO is the same as the frequency band of the VCO.

In such an operation of the FSPD, as in FIG. 5B, the reference signal $S_{REF}$ continuously samples only a specific voltage value of the output signal $S_{VCO}$. Any loss of a phase error detection gain does not occur by a pole generated in the FSPD.

It may be interpreted that a phase error of the output signal $S_{VCO}$ is down-converted without any change without being attenuated by the pole in a frequency region as in FIG. 5C. This may have an effect, such as an effect in that two signals of the same frequency band are mixed.

However, it is difficult to generate a reference signal that practically has very low jitter and also has a high frequency of 100 GHz. In contrast, such a reference signal does not need to be a continuous signal because the signal is used to only detect a phase error of a PLL output unit. Accordingly, the present disclosure proposes a PG-ILFM PD including an R-VCO and an FSPD in order to improve the problems by using such a characteristic.

Figure 6A:
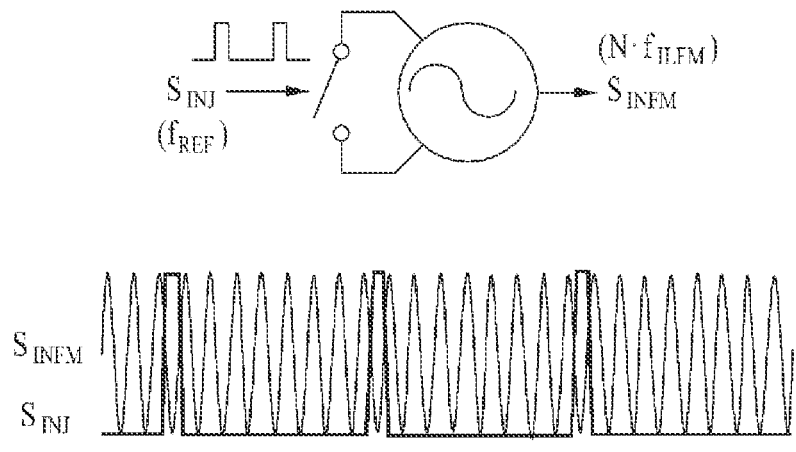
FIGS. 6A and 6B are diagrams for describing a method of generating a reference signal according to an embodiment of the present disclosure.
Figure 6B:
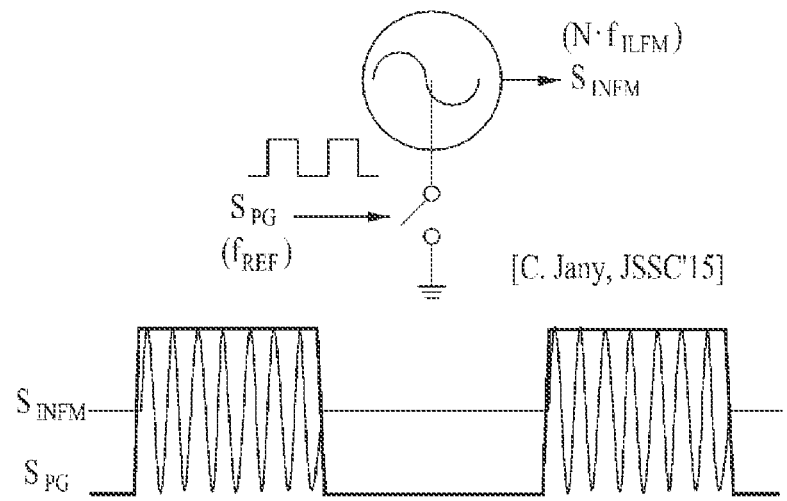

FIGS. 6A and 6B are diagrams for describing a method of generating a reference signal according to an embodiment of the present disclosure.

FIG. 6A is a diagram for describing an injection locked frequency multiplier (ILFM) according to a conventional technology. FIG. 6B is a diagram for describing a PG-ILFM structure applied to the present disclosure.

In the present disclosure, the PG-ILFM structure is applied as a method of generating a reference signal for solving the problems described in FIGS. 5A, 5B, and 5C, as in FIG. 6B.

The ILFM illustrated in FIG. 6A according to a conventional technology is a method of injecting a short pulse into a VCO output unit having a continuous output signal, and has a disadvantage in that performance is deteriorated as a frequency multiplier becomes higher.

In contrast, the PG-ILFM method illustrated in FIG. 6B and applied to the present disclosure is a method of repeatedly turning on/off power of a VCO based on a reference signal. In this method, the phase of the output signal $S_{ILFM}$ of the VCO can be perfectly synchronized with the reference signal $S_{PG}$ regardless of an output frequency and a frequency multiplier thereof.

As described above, the proposed method itself cannot be disposed at the output stage of a signal generator because it has a discontinuous output signal, but is an optimal structure to be used as a reference signal of 100 GHz.

Figures 7A, 7B:
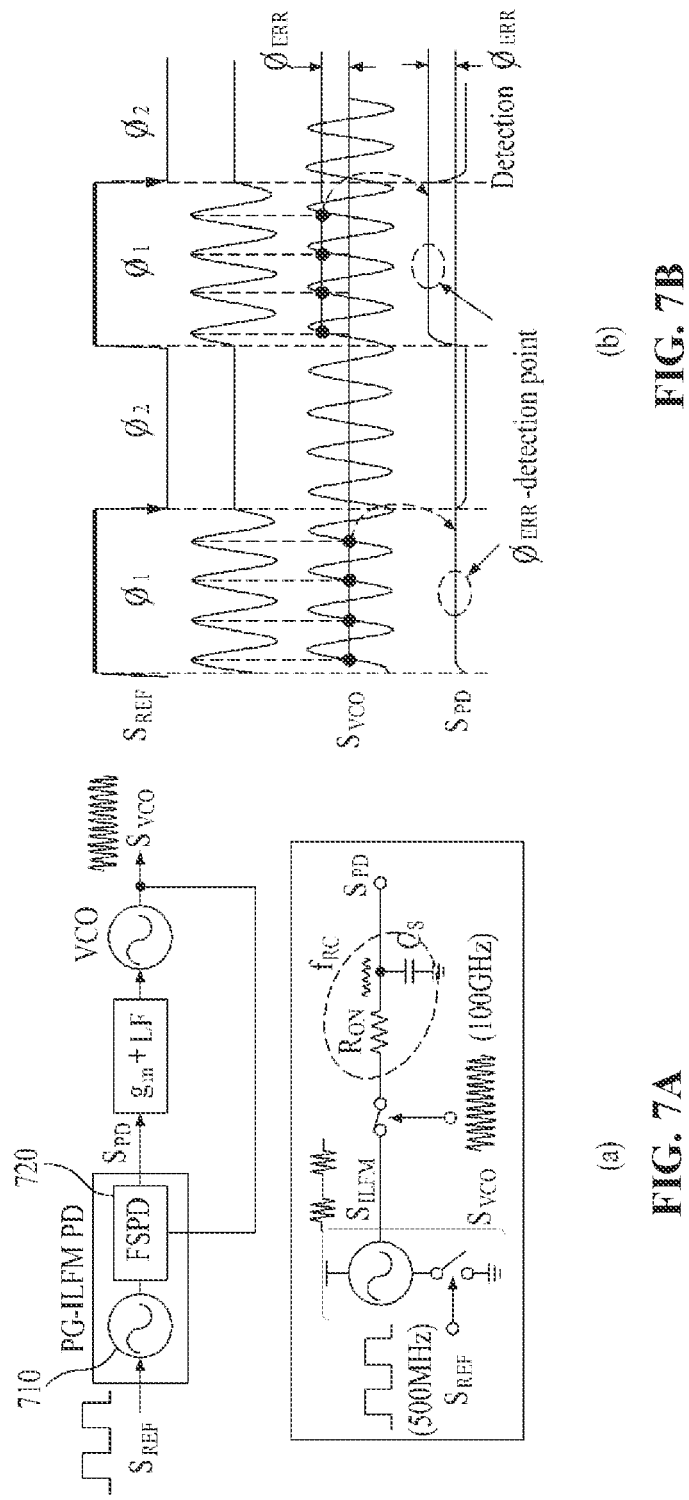
FIGS. 7A and 7B are diagrams for describing the PG-ILFM PD according to an embodiment of the present disclosure.

FIGS. 7A and 7B are diagrams for describing a PG-ILFM PD according to an embodiment of the present disclosure.

FIG. 7A is a circuit diagram of the PG-ILFM PD according to an embodiment of the present disclosure. FIG. 7B is a timing diagram of an operation of the PG-ILFM PD.

As described above, the PG-ILFM PD according to an embodiment of the present disclosure includes an R-VCO 710 and an FSPD 720.

The R-VCO 710 according to an embodiment of the present disclosure repeats the supply and blocking of an input signal based on the reference signal $S_{REF}$.

The FSPD 720 according to an embodiment of the present disclosure receives the output signal $S_{ILFM}$ of the R-VCO 710 as a reference signal for sampling, and detects a phase error of an M-VCO.

The M-VCO according to an embodiment of the present disclosure feeds back the final output signal of the FSPD 720 of the PG-ILFM PD so that the FSPD 720 detects a phase error of the M-VCO.

The R-VCO 710 according to an embodiment of the present disclosure has the same structure as the M-VCO and is used to multiply the frequency of the reference signal $S_{REF}$.

The R-VCO 710 according to an embodiment of the present disclosure outputs the output signal only while the reference signal $S_{REF}$ is high ($\Phi_1$). While the reference signal $S_{REF}$ is high ($\Phi_1$), the output signal $S_{ILFM}$ of the R-VCO 710 samples the phase error of the M-VCO through the FSPD 720. Accordingly, the phase of the output signal $S_{ILFM}$ of the R-VCO 710 can be synchronized with the reference signal $S_{REF}$ regardless of a frequency multiplication factor.

The output signal $S_{ILFM}$ of the R-VCO 710 and the output signal $S_{VCO}$ of the M-VCO according to an embodiment of the present disclosure have the same frequency band. Accordingly, a phase error detection gain can be increased because phase error information detected by the PG-ILFM PD is output without a loss of the phase error information.

FIGS. 8A, 8B, and 8C illustrate simulation results of a phase error detection gain of the PG-ILFM PD according to an embodiment of the present disclosure.

FIG. 8A is a circuit diagram of an SSPD according to a conventional technology. FIG. 8B is a circuit diagram of the proposed PG-ILFM PD. FIG. 8C is a graph for comparing simulation results of the proposed PG-ILFM PD with those of the SSPD.

Referring to FIG. 8C, it may be seen, from the simulation results of the SSPD according to a conventional technology and the simulation results of the proposed PG-ILFM PD, that the proposed PG-ILFM PD has a phase error detection gain that is 10 times or more higher than that according to a conventional technology.

Figure 9:
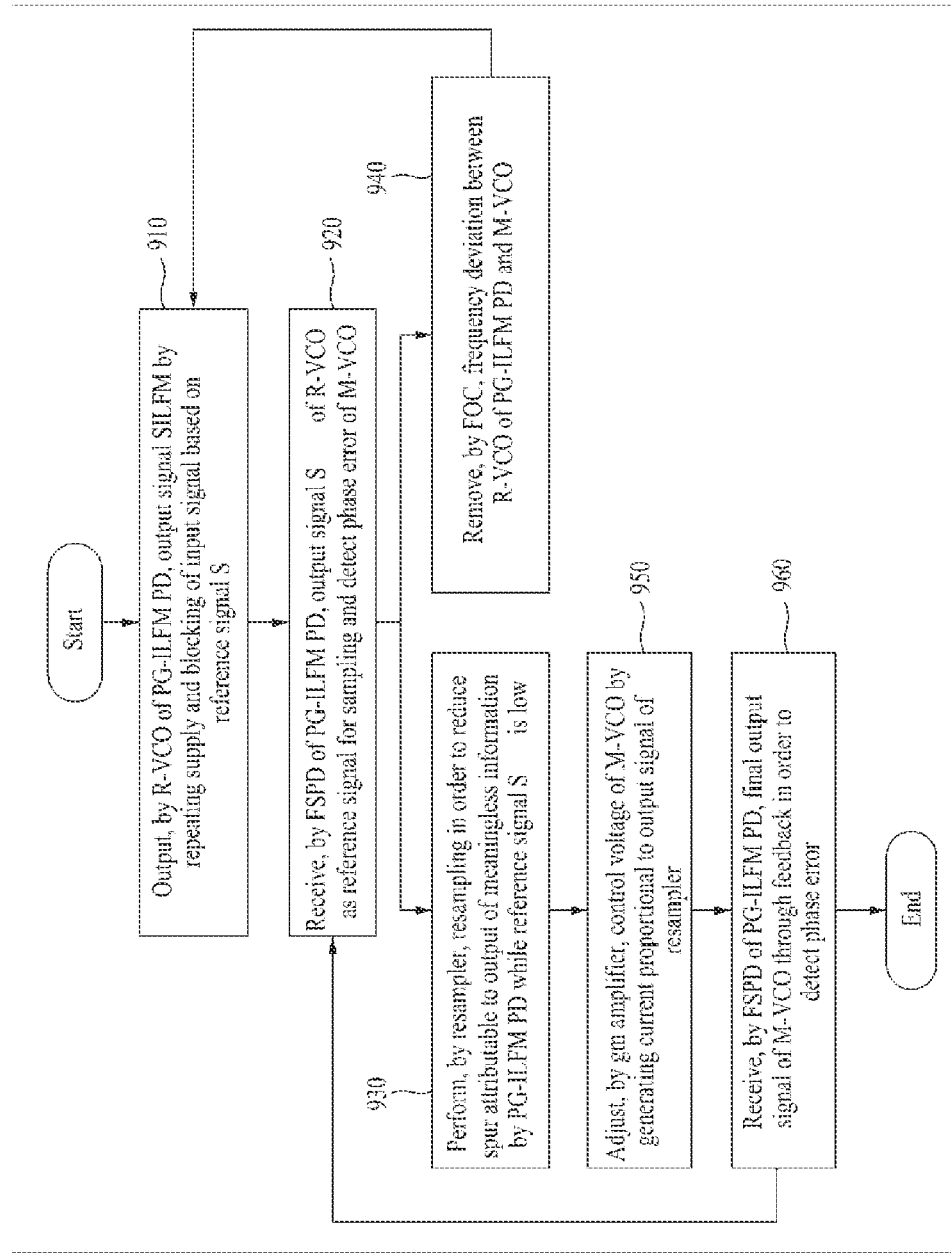
FIG. 9 is a flowchart for describing an operating method of an ultra-low jitter low-power PLL using a phase detector based on the PG-ILFM according to an embodiment of the present disclosure.

FIG. 9 is a flowchart for describing an operating method of the ultra-low jitter low-power PLL using a PG-ILFM PD according to an embodiment of the present disclosure.

An operating method of the ultra-low jitter low-power PLL using a PG-ILFM PD including the PG-ILFM PD, the resampler, the FOC, the gm amplifier, the loop filter, and the M-VCO according to an embodiment of the present disclosure includes step 910 of outputting, by the R-VCO of the PG-ILFM PD, the output signal $S_{ILFM}$ by repeating the supply and blocking of an input signal based on the reference signal $S_{REF}$, step 920 of receiving, by the FSPD of the PG-ILFM PD, the output signal $S_{ILFM}$ of the R-VCO as a reference signal for sampling and detecting a phase error of the M-VCO, step 930 of performing, by the resampler, resampling in order to reduce a spur attributable to the output of meaningless information by the PG-ILFM PD while the reference signal $S_{REF}$ is low, step 940 of removing, by the FOC, a frequency deviation between the R-VCO of the PG-ILFM PD and the M-VCO, step 950 of adjusting, by the gm amplifier, a control voltage of the M-VCO by generating a current proportional to the output signal of the resampler, and step 960 of receiving, by the FSPD of the PG-ILFM PD, the final output signal of the M-VCO through feedback in order to detect a phase error.

The PG-ILFM PD according to an embodiment of the present disclosure is a power-gating injection-locked frequency multiplier-based phase detector, and includes the replica voltage controlled oscillator (R-VCO) and the fundamental sampling phase detector (FSPD).

In step 910, the R-VCO of the PG-ILFM PD outputs the output signal $S_{ILFM}$ by repeating the supply and blocking of an input signal based on the reference signal $S_{REF}$.

The R-VCO according to an embodiment of the present disclosure has the same structure as the M-VCO, and is used to multiply the frequency of the reference signal $S_{REF}$.

The R-VCO according to an embodiment of the present disclosure synchronizes the phase of the output signal $S_{ILFM}$ of the R-VCO with the reference signal $S_{REF}$ regardless of a frequency multiplication factor by outputting an output signal only while the reference signal $S_{REF}$ is high.

The output signal $S_{ILFM}$ of the R-VCO and the output signal $S_{VCO}$ of the M-VCO according to an embodiment of the present disclosure have the same frequency band. Accordingly, a phase error detection gain can be increased because phase error information detected by the PG-ILFM PD is output without a loss of the phase error information.

In step 920, the FSPD of the PG-ILFM PD receives the output signal $S_{ILFM}$ of the R-VCO as a reference signal for sampling and detects a phase error of the M-VCO.

In step 930, the resampler performs resampling in order to reduce a spur attributable to the output of meaningless information by the PG-ILFM PD while the reference signal $S_{REF}$ is low.

In step 940, the FOC removes a frequency deviation between the R-VCO of the PG-ILFM PD and the M-VCO.

The FOC according to an embodiment of the present disclosure alternately operates at a different phase with respect to a resampling operation for the phase locking of a PLL while the reference signal $S_{REF}$ is high. In other words, after the resampling operation for the phase locking, the FOC 430 performs resampling for reducing a frequency offset of the R-VCO.

In step 950, the gm amplifier adjusts a control voltage of the M-VCO by generating a current proportional to the output signal of the resampler. The loop filter according to an embodiment of the present disclosure may transmit only a frequency signal having a cutoff frequency or less by attenuating a signal having a frequency equal to or higher than a specific cutoff frequency of a signal output by the gm amplifier.

In step 960, the final output signal of the M-VCO is feed back to the FSPD of the PG-ILFM PD so that the FSPD of the PG-ILFM PD detects a phase error.

FIGS. 10A, 10B, 10C, and 10D are diagrams for describing a major operation process of the PLL according to an embodiment of the present disclosure.

Figure 10A:
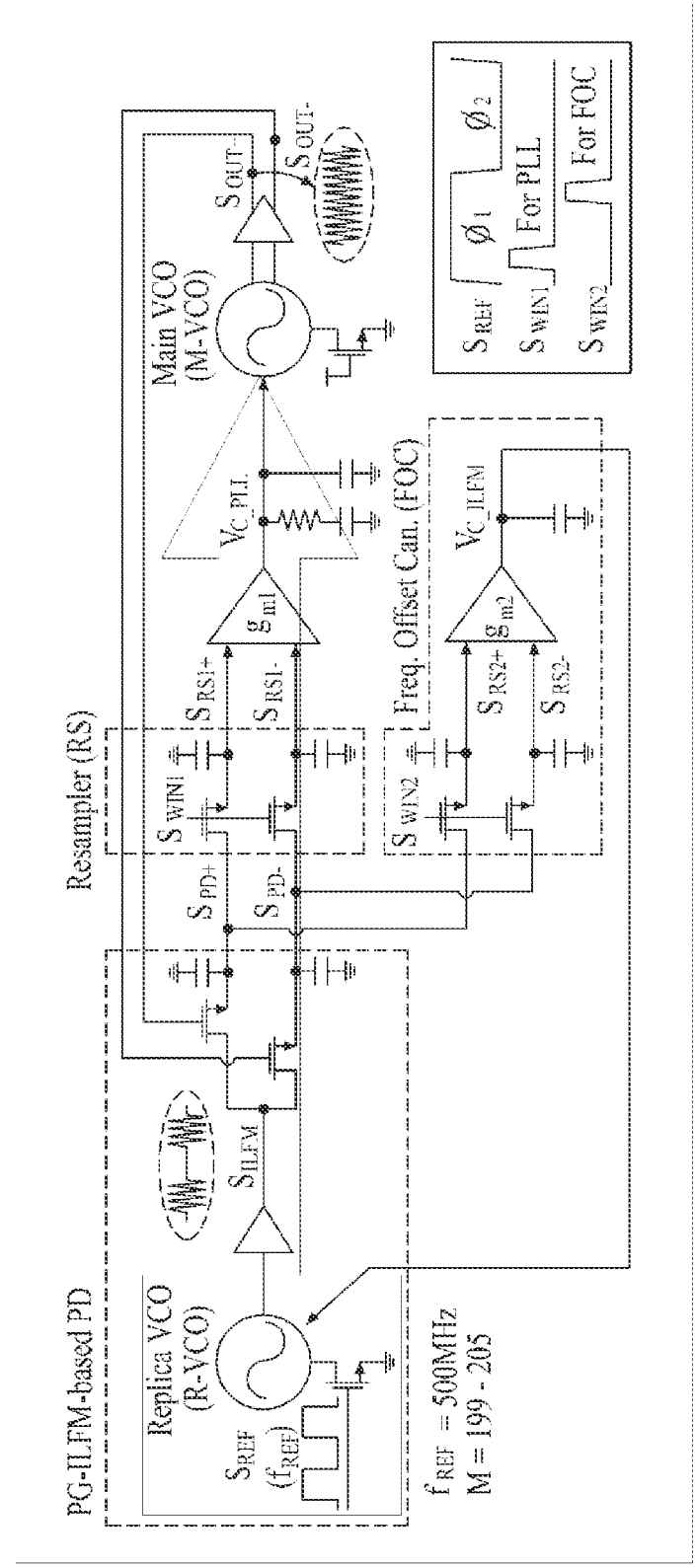
FIGS. 10A, 10B, 10C, and 10D are diagrams for describing a major operation process of the PLL according to an embodiment of the present disclosure.
Figure 10B:
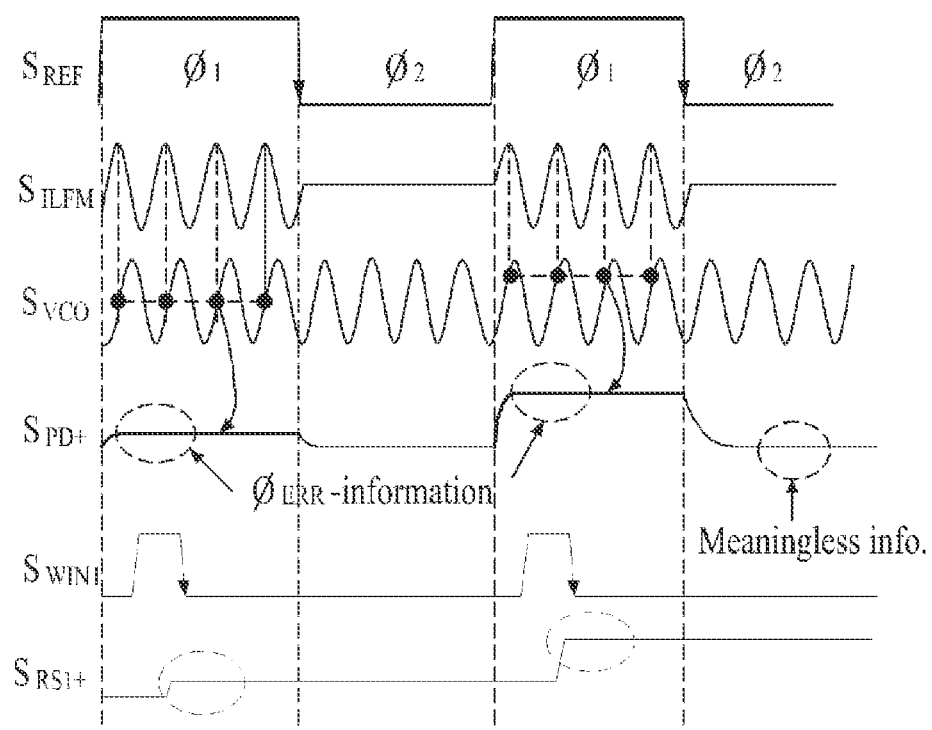
Figure 10C:
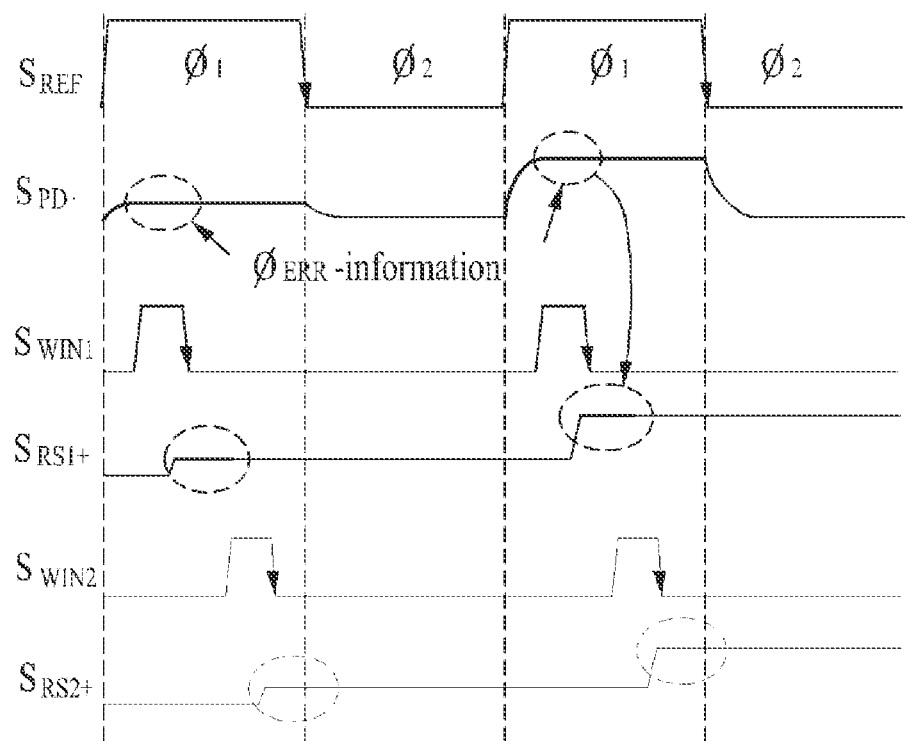
Figure 10D:
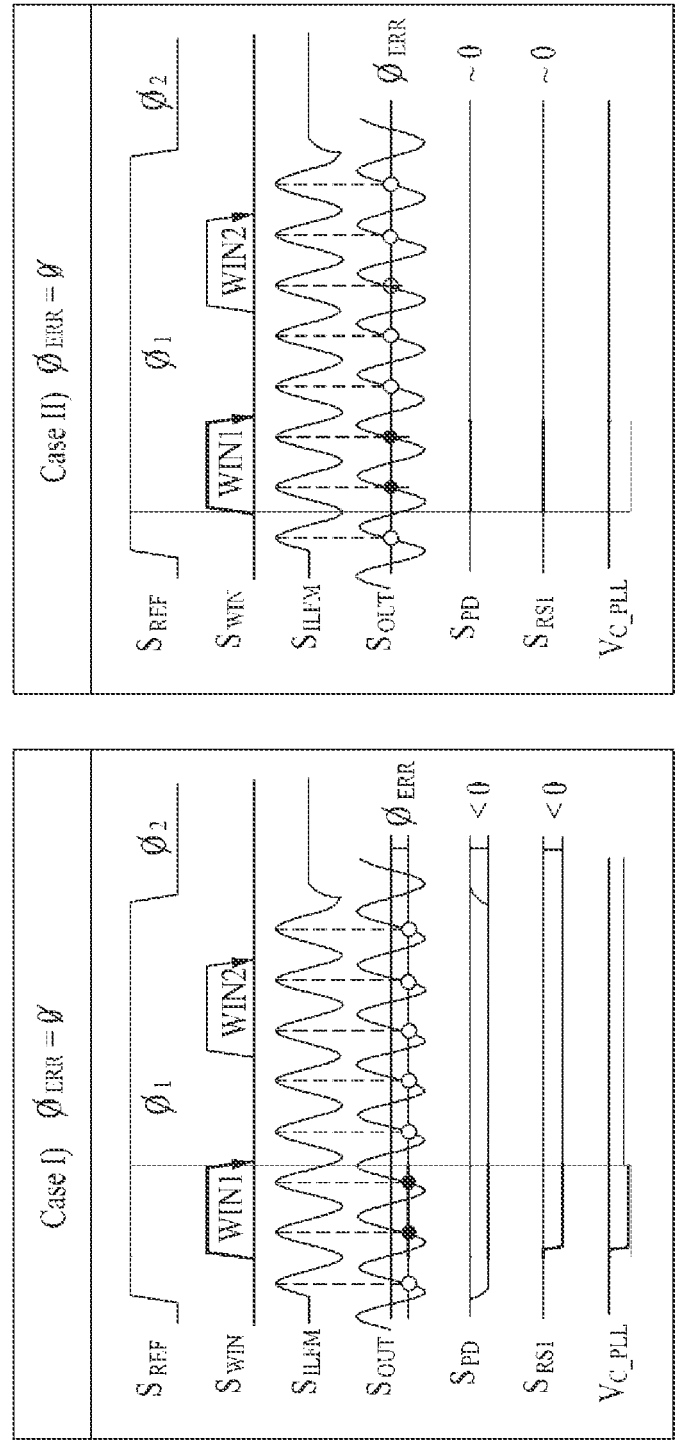

FIG. 10A illustrates a circuit path of a major operation of the PLL according to an embodiment of the present disclosure. FIG. 10B is a timing diagram of the PG-ILFM PD during the major operation of the PLL. FIG. 10C is a timing diagram of resampling during the major operation of the PLL. FIG. 10D is the entire timing diagram of the major operation of the PLL.

Arrows in FIG. 10A illustrate directions in which the major operation of the PLL for removing a phase error of the PLL output unit is performed.

First, referring to FIG. 10B, the PG-ILFM PD samples the output signal $S_{VCO}$ of the M-VCO as the low jitter signal $S_{ILFM}$. Accordingly, phase error information of the output signal $S_{VCO}$ of the M-VCO is directly delivered as the input signal $S_{PD}$ of the resampler (RS).

However, in this case, since the PG-ILFM PD is turned off while $\Phi_2$, the input signal $S_{PD}$ of the resampler has meaningless information, so that a spur may be caused. Accordingly, as in FIG. 10C, the resampler selects only an interval in which the input signal $S_{PD}$ has meaningful information and delivers the corresponding input signal $S_{PD}$ as the output signal SRs of the resampler.

Referring to FIG. 10D, if a phase error of $S_{OUT}$ is not 0 and the phase of the low jitter signal $S_{ILFM}$ is ahead of an output signal $S_{OUT}$ (i.e., the output signal $S_{VCO}$ of the M-VCO), the input signal $S_{PD}$ samples a voltage lower than an ideal phase locking point.

Such a voltage of the input signal $S_{PD}$ is delivered as $S_{RS1}$ during a window signal $S_{WIN1}$. Accordingly, the gm amplifier adjusts a phase error of the PLL by generating a current proportional to a value of $S_{RS1}$ in a way that a control voltage VC PLL of the M-VCO eliminates the phase error of the PLL.

In contrast, if the phase error of $S_{OUT}$ is 0, $S_{OUT}$ is locked to the low jitter signal $S_{ILFM}$ and a center phase, and a value of the control voltage is maintained without any change.

Figure 11A:
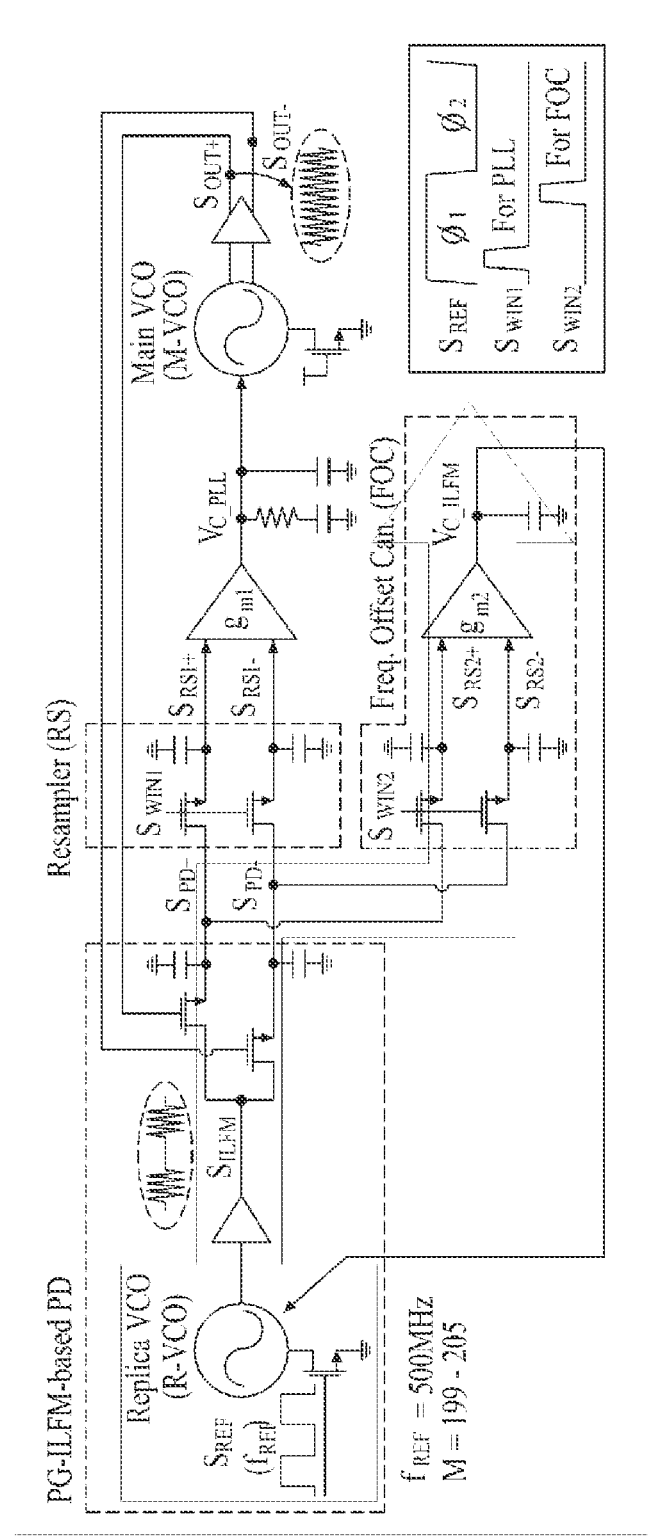
FIGS. 11A, 11B, and 11C are diagrams for describing an operating process of a frequency offset canceller according to an embodiment of the present disclosure.
Figure 11B:
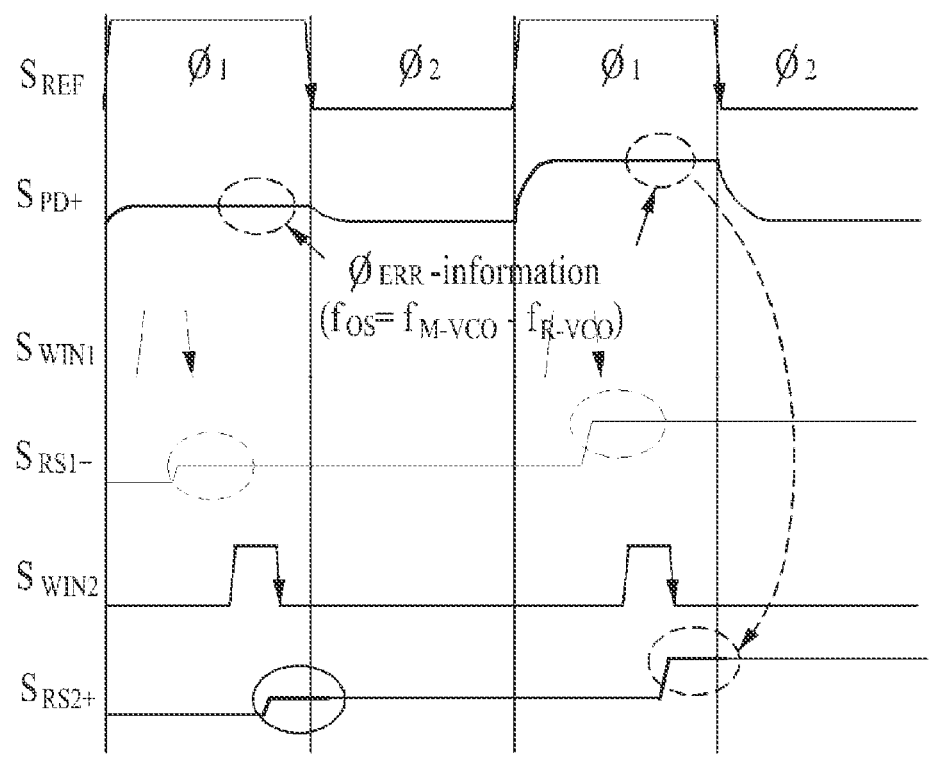
Figure 11C:
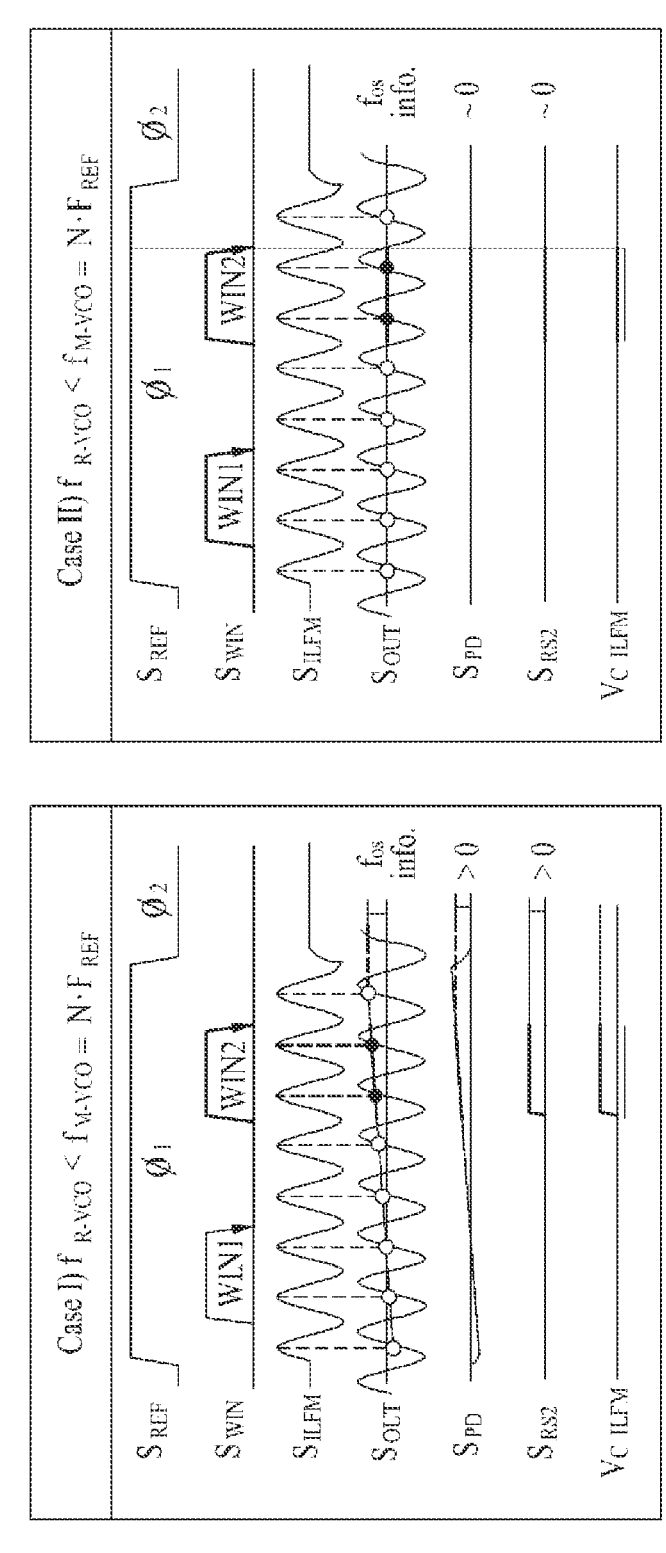

FIGS. 11A, 11B, and 11C are diagrams for describing an operating process of a frequency offset canceller according to an embodiment of the present disclosure.

FIG. 11A illustrates a circuit path of an operation of the FOC according to an embodiment of the present disclosure. FIG. 11B is a timing diagram of resampling during the operation of the FOC. FIG. 11C is the entire timing diagram of the operation of the FOC.

Arrows in FIG. 11A illustrate the directions of the operation of the FOC for eliminating a frequency deviation between the R-VCO of the PG-ILFM PD and the M-VCO according to an embodiment of the present disclosure.

The operation of the FOC according to an embodiment of the present disclosure performs an auxiliary role so that the PLL can stably achieve ultra-low noise performance even in a process, voltage, and temperature (PVT) change. The proposed PLL and FOC alternately operate at different locations during the phase ($\Phi_1$).

For the operation of the FOC according to an embodiment of the present disclosure, separately from the main path of the PLL, the FOC further includes another resampler as in FIG. 11A. The resampler of the FOC according to an embodiment of the present disclosure resamples a value of the input signal $S_{PD}$ at the location of a window signal $S_{WIN2}$. Such a window signal $S_{WIN2}$ is also generated by the reference signal $S_{REF}$, and a location thereof is behind the window signal $S_{WIN1}$. Referring to FIG. 11B, the resampler of the proposed FOC samples, from the window signal $S_{WIN2}$, a frequency offset of the R-VCO present in the PG-ILFM PD, and delivers a corresponding signal as $S_{RS2}$.

FIG. 11C illustrates an ideal operation of the proposed FOC. It may be assumed that the PLL has already been locked during an operation of the FOC because a bandwidth of the proposed PLL is much wider than a bandwidth of the FOC.

In other words, it may be assumed that an output signal $S_{OUT}$ has been accurately locked to the phase of the output signal $S_{ILFM}$ during the window signal $S_{WIN1}$. At this time, it may be seen that when a frequency offset is present in the R-VCO (Case 1 in FIG. 11C), the phase of the output signal $S_{ILFM}$ gradually becomes distant from an ideal point. As a result, such a frequency offset appears as a difference between the phases of the output signal $S_{ILFM}$ and the output signal $S_{OUT}$ during the window signal $S_{WIN2}$. Accordingly, the frequency offset can be removed by sampling a value of the input signal $S_{PD}$ in the portion of the window signal $S_{WIN2}$, delivering a corresponding signal as $S_{RS2}$, and thus adjusting a control voltage of the R-VCO.

Through the ultra-low jitter low-power PLL using the PG-ILFM PD according to embodiments of the present disclosure, a high phase error detection gain can be achieved, phase noise within the bandwidth of the PLL can be significantly reduced, and the bandwidth of the PLL can be expanded to the extent that phase noise of the W-band VCO can be sufficiently reduced due to the reduced phase noise within the bandwidth. As a result, ultra-low noise performance can be achieved, and the ultra-low jitter low-power PLL can be used as a local oscillator for generating a carrier wave of a transceiver stage for 6G communication. Furthermore, the ultra-low jitter low-power PLL has a high degree of integration because it is fabricated using a CMOS process compared to an SiGe or InP process frequently used in the existing THz frequency band, and can be implemented with low power because the ultra-low jitter low-power PLL is a frequency multiplier that does not use a frequency divider.

As described above, although the embodiments have been described in connection with the limited embodiments and the drawings, those skilled in the art may modify and change the embodiments in various ways from the description. For example, proper results may be achieved although the aforementioned descriptions are performed in order different from that of the described method and/or the aforementioned elements, such as the system, configuration, device, and The embodiments of the disclosure in which an exclusive property or privilege is claimed are defined as follows:

1. A phase-locked loop comprising:
 a power-gating injection-locked frequency multiplier-based phase detector (PG-ILFM PD),
 wherein the PG-ILFM PD comprises:
 a replica voltage controlled oscillator (R-VCO) configured to cut off the power supply of the R-VCO repeatedly based on a reference signal $S_{REF}$; and
 a fundamental sampling phase detector (FSPD) configured to receive an output signal $S_{ILFM}$ of the R-VCO as a reference signal for sampling and detect a phase error of a main voltage controlled oscillator (M-VCO), wherein the R-VCO has a structure identical with a structure of the M-VCO and is used to multiply a frequency of the reference signal $S_{REF}$.

2. The phase-locked loop of claim 1, wherein the M-VCO is configured to detect the phase error by feeding a final output signal back to the FSPD of the PG-ILFM PD.

3. The phase-locked loop of claim 1, wherein the R-VCO is configured to synchronize a phase of the output signal $S_{ILFM}$ of the R-VCO with the reference signal $S_{REF}$ regardless of a frequency multiplication factor by outputting an output signal only while the reference signal $S_{REF}$ is high.

4. The phase-locked loop of claim 1, wherein:
 the output signal $S_{ILFM}$ of the R-VCO and an output signal $S_{VCO}$ of the M-VCO have an identical frequency band, and
 phase error information detected in the PG-ILFM PD is outputted without a loss of the phase error information, thereby increasing a phase error detection gain.

5. The phase-locked loop of claim 1, further comprising a resampler configured to perform resampling in order to reduce a spur attributable to an output of meaningless information by the PG-ILFM PD while the reference signal $S_{REF}$ is low.

6. The phase-locked loop of claim 5, further comprising a gm amplifier configured to adjust a control voltage of the M-VCO by generating a current proportional to an output signal of the resampler.

7. A phase-locked loop comprising:
 a power-gating injection-locked frequency multiplier-based phase detector (PG-ILFM PD),
 wherein the PG-ILFM PD comprises:
 a replica voltage controlled oscillator (R-VCO) configured to cut off the power supply of the R-VCO repeatedly based on a reference signal $S_{REF}$; and
 a fundamental sampling phase detector (FSPD) configured to receive an output signal $S_{ILFM}$ of the R-VCO as a reference signal for sampling and detect a phase error of a main voltage controlled oscillator (M-VCO), wherein the phase-locked loop further comprises a frequency offset canceller (FOC) configured to remove a frequency deviation between the R-VCO of the PG-ILFM PD and the M-VCO.

8. The phase-locked loop of claim 7, wherein the FOC is configured to alternately operate at a different phase with respect to a resampling operation for phase locking of the phase-locked loop while the reference signal $S_{REF}$ is high.

9. The phase-locked loop of claim 8, wherein the FOC is configured to perform resampling for reducing a frequency offset of the R-VCO after the resampling operation for the phase locking.

10. An operating method of a phase-locked loop comprising a power-gating injection-locked frequency multiplier-based phase detector (PG-ILFM PD), the operating method comprising:
 outputting, by a replica voltage controlled oscillator (R-VCO) of the PG-ILFM PD, an output signal $S_{ILFM}$ by repeatedly manipulating an input voltage of the R-VCO based on a reference signal $S_{REF}$; and
 receiving, by a fundamental sampling phase detector (FSPD) of the PG-ILFM PD, the output signal $S_{ILFM}$ of the R-VCO as a reference signal for sampling and detecting a phase error of a main voltage controlled oscillator (M-VCO), wherein outputting, by the R-VCO of the PG-ILFM PD, the output signal $S_{ILFM}$ comprises using the R-VCO having a structure identical with a structure of the M-VCO to multiply a frequency of the reference signal $S_{REF}$.

11. The operating method of claim 10, further comprising receiving, by the FSPD of the PG-ILFM PD, a final output signal of the M-VCO through feedback to detect the phase error.

12. The operating method of claim 10, wherein the R-VCO is configured to synchronize a phase of the output signal $S_{ILFM}$ of the R-VCO with the reference signal $S_{REF}$ regardless of a frequency multiplication factor by outputting an output signal only while the reference signal $S_{REF}$ is high.

13. The operating method of claim 10, wherein:
 the output signal $S_{ILFM}$ of the R-VCO and an output signal $S_{VCO}$ of the M-VCO have an identical frequency band, and
 phase error information detected in the PG-ILFM PD is outputted without a loss of the phase error information, thereby increasing a phase error detection gain.

14. The operating method of claim 10, further comprising performing, by a resampler, resampling to reduce a spur attributable to an output of meaningless information by the PG-ILFM PD while the reference signal $S_{REF}$ is low.

15. The operating method of claim 14, further comprising adjusting, by a gm amplifier, a control voltage of the M-VCO by generating a current proportional to an output signal of the resampler.

16. The operating method of claim 10, further comprising removing, by a frequency offset canceller (FOC), a frequency deviation between the R-VCO of the PG-ILFM PD and the M-VCO.

17. The operating method of claim 16, wherein removing, by the FOC, the frequency deviation between the R-VCO of the PG-ILFM PD and the M-VCO comprises alternately operating at a different phase with respect to a resampling operation for phase locking of the phase-locked loop while the reference signal $S_{REF}$ is high.

18. The operating method of claim 17, wherein the FOC is configured to perform resampling for reducing the frequency offset of the R-VCO after the resampling operation for the phase locking.

* * * * *